United States Patent
Deng

(10) Patent No.: US 10,121,883 B2
(45) Date of Patent: Nov. 6, 2018

(54) MANUFACTURING METHOD OF TOP GATE THIN-FILM TRANSISTOR

(71) Applicant: Shenzhen China Star Optoelectronics Technology Co., Ltd., Shenzhen (CN)

(72) Inventor: Yong Deng, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 199 days.

(21) Appl. No.: 15/121,040

(22) PCT Filed: Jul. 15, 2016

(86) PCT No.: PCT/CN2016/090106
§ 371 (c)(1),
(2) Date: Aug. 24, 2016

(87) PCT Pub. No.: WO2017/219412
PCT Pub. Date: Dec. 28, 2017

(65) Prior Publication Data
US 2018/0197973 A1    Jul. 12, 2018

(30) Foreign Application Priority Data
Jun. 22, 2016   (CN) .......................... 2016 1 0458176

(51) Int. Cl.
H01L 29/66       (2006.01)
H01L 29/786      (2006.01)
(Continued)

(52) U.S. Cl.
CPC ...... *H01L 29/66969* (2013.01); *H01L 21/443* (2013.01); *H01L 21/461* (2013.01); *H01L 21/477* (2013.01); *H01L 29/42384* (2013.01); *H01L 29/495* (2013.01); *H01L 29/7869* (2013.01)

(58) Field of Classification Search
None
See application file for complete search history.

(56) References Cited

U.S. PATENT DOCUMENTS

| | | | | |
|---|---|---|---|---|
| 2011/0062431 A1* | 3/2011 | Shieh | .................... | H01L 21/268 257/43 |
| 2012/0001167 A1* | 1/2012 | Morosawa | .......... | H01L 29/7869 257/43 |
| 2012/0074399 A1* | 3/2012 | Den Boer | ......... | H01L 29/78603 257/43 |

FOREIGN PATENT DOCUMENTS

| CN | 103314431 A | 9/2013 |
|---|---|---|
| CN | 103477441 A | 12/2013 |

* cited by examiner

*Primary Examiner* — Alexander Ghyka
(74) *Attorney, Agent, or Firm* — Leong C. Lei

(57) ABSTRACT

The present invention provides a manufacturing method of a top gate thin-film transistor, which includes forming a reducing metal layer on an oxide semiconductor layer and applying laser annealing to reduce the oxide semiconductor layer that is covered with the reducing metal layer to conductors to respectively form a source contact zone and a drain contact zone, such that the source contact zone and the drain contact zone that have been reduced to conductors are used to respectively contact a source electrode and a drain electrode thereby greatly reducing the contact resistance of the source electrode and the drain electrode and improving the performance of a top gate thin-film transistor. The manufacturing process is simple.

18 Claims, 5 Drawing Sheets

(51) Int. Cl.
*H01L 29/423* (2006.01)
*H01L 21/461* (2006.01)
*H01L 21/443* (2006.01)
*H01L 29/49* (2006.01)
*H01L 21/477* (2006.01)

MANUFACTURING METHOD OF TOP GATE THIN-FILM TRANSISTOR

BACKGROUND OF THE INVENTION

1. Field of the Invention

The present invention relates to the field of display technology, and in particular to a manufacturing method of a top gate thin-film transistor.

2. The Related Arts

Flat panel display devices have various advantages, such as thin device body, lower power consumption, and being free of radiation, and are thus widely used. The flat panel display devices that are currently used include liquid crystal displays (LCDs) and organic light emitting displays (OLEDs).

In a flat panel display device, a thin-film transistor (TFT) is commonly used as a switching element to control the operation of a pixel or as a driver element for driving the pixel.

An oxide semiconductor thin-film transistor has relatively high electron mobility and, compared to low temperature poly-silicon (LTPS), the oxide semiconductor thin-film transistor has a simple manufacturing process and is higher compatibility with amorphous silicon (a-Si) thin-film transistor manufacturing processes, so as to show prosperous future development for applications and thus become a hot spot of research of the industry. For the contemporary researches of oxide semiconductors, indium gallium zinc oxide (IGZO) semiconductors are the most mature ones. IGZO semiconductors are an amorphous semiconductor containing indium, gallium, and zinc, having 20 to 30 times of carrier mobility of that of amorphous silicon, and once used in a flat panel display device, would remarkably increase charging/discharging speed of a thin-film transistor applying to a pixel electrode, increase the response speed of a pixel, realize faster refresh rate and also fast response, and also greatly increase row scanning speed of pixels, thereby making it possible to achieve super high resolution.

According to the structure, thin-film transistors can be classified as bottom gate thin-film transistors and top gate thin-film transistors, wherein the top gate thin-film transistors do not induce parasitic capacitance between source/drain electrodes and a gate metal and can be made in the form of a short channel to increase an ON state current of the thin-film transistor, making it a hot spot of recent researches of this industry. A conventional top gate thin-film transistor generally comprises: a base plate, a buffer layer formed on the base plate, an oxide semiconductor layer formed on the buffer layer, a gate insulation layer formed on the oxide semiconductor layer, a gate electrode formed on the gate insulation layer, an interlayer insulation layer formed on the gate electrode, and a source electrode and a drain electrode formed on the interlayer insulation layer such that the source electrode and the drain electrode are set in contact with two ends of the oxide semiconductor layer through vias extending through the interlayer insulation layer. The direct contact of the source electrode and the drain electrode with the oxide semiconductor layer makes a contact resistance induced therebetween very large, severely affecting the performance of the thin-film transistor. A process involving plasma treatment is commonly adopted in the industry to make low resistance contact zones at the two ends of the oxide semiconductor layer in order to reduce the contact resistance between the source and drain electrodes and the oxide semiconductor layer. However, a device manufactured with such a process has relatively poor stability.

SUMMARY OF THE INVENTION

An object of the present invention is to provide a manufacturing method of a top gate thin-film transistor, which reduces contact resistance of source and drain electrodes of the top gate thin-film transistor and improve the performance and stability of the top gate thin-film transistor.

To achieve the above object, the present invention provides a manufacturing method of a top gate thin-film transistor, which comprises the following steps:

Step 1: providing a base plate, forming a buffer layer on the base plate, and forming an oxide semiconductor layer on the buffer layer;

Step 2: forming a gate insulation layer and a gate electrode on the oxide semiconductor layer in a manner of being stacked in sequence from bottom to top, such that the gate insulation layer and the gate electrode cover a middle zone of the oxide semiconductor layer with two ends of the oxide semiconductor layer exposed;

Step 3: forming a reducing metal layer on the two exposed ends of the oxide semiconductor layer;

Step 4: subjecting the oxide semiconductor layer that is covered with the reducing metal layer to laser annealing in order to reduce the oxide semiconductor layer that is covered with the reducing metal layer to conductors that form a source contact zone and a drain contact zone respectively located at two ends of the oxide semiconductor layer;

Step 5: subsequently forming an interlayer insulation layer on the gate electrode, the source contact zone, and the drain contact zone and a first via and a second via extending through the interlayer insulation layer, such that the first via and the second via respectively expose the source contact zone and the drain contact zone; and Step 6: forming a source electrode and a drain electrode on the interlayer insulation layer, such that the source electrode and the drain electrode are respectively set in contact with the source contact zone and the drain contact zone through the first via and the second via.

In Step 3, the reducing metal layer is formed of a material comprising manganese or aluminum.

In Step 3, the reducing metal layer has a thickness less than 100 Å.

In Step 3, the reducing metal layer is formed with physical vapor deposition.

The oxide semiconductor layer is formed of a material comprising indium gallium zinc oxide (IGZO).

The gate electrode, the source electrode, and the drain electrode are formed of a material comprising molybdenum.

In Step 2, a dry etching operation is applied to form the gate insulation layer and the gate electrode.

Step 3 further comprises forming the reducing metal layer on the gate electrode and the buffer layer, such that a portion of the reducing metal layer on the gate electrode is separated from a portion of the reducing metal layer on the oxide semiconductor layer; and in Step 5, the interlayer insulation layer covers the portion of the reducing metal layer on the gate electrode.

In Step 3, a portion of the reducing metal layer on the oxide semiconductor layer is separated from a portion of the reducing metal layer on the buffer layer.

The buffer layer, the gate insulation layer, and the interlayer insulation layer are formed of a material comprising one or a stacked combination of multiple ones of silicon oxide and silicon nitride.

The present invention also provides a manufacturing method of a top gate thin-film transistor, which comprises the following steps:

Step 1: providing a base plate, forming a buffer layer on the base plate, and forming an oxide semiconductor layer on the buffer layer;

Step 2: forming a gate insulation layer and a gate electrode on the oxide semiconductor layer in a manner of being stacked in sequence from bottom to top, such that the gate insulation layer and the gate electrode cover a middle zone of the oxide semiconductor layer with two ends of the oxide semiconductor layer exposed;

Step 3: forming a reducing metal layer on the two exposed ends of the oxide semiconductor layer;

Step 4: subjecting the oxide semiconductor layer that is covered with the reducing metal layer to laser annealing in order to reduce the oxide semiconductor layer that is covered with the reducing metal layer to conductors that form a source contact zone and a drain contact zone respectively located at two ends of the oxide semiconductor layer;

Step 5: subsequently forming an interlayer insulation layer on the gate electrode, the source contact zone, and the drain contact zone and a first via and a second via extending through the interlayer insulation layer, such that the first via and the second via respectively expose the source contact zone and the drain contact zone; and Step 6: forming a source electrode and a drain electrode on the interlayer insulation layer, such that the source electrode and the drain electrode are respectively set in contact with the source contact zone and the drain contact zone through the first via and the second via;

wherein in Step 3, the reducing metal layer is formed of a material comprising manganese or aluminum; and wherein in Step 3, the reducing metal layer has a thickness less than 100 Å.

The efficacy of the present invention is that the present invention provides a manufacturing method of a top gate thin-film transistor, which comprises forming a reducing metal layer on an oxide semiconductor layer and applying laser annealing to reduce the oxide semiconductor layer that is covered with the reducing metal layer to conductors to respectively form a source contact zone and a drain contact zone, such that the source contact zone and the drain contact zone are used to respectively contact a source electrode and a drain electrode thereby reducing the contact resistance of the source electrode and the drain electrode and improving the performance of a top gate thin-film transistor, and compared to a process involving plasma treatment, the top gate thin-film transistor manufactured with the present invention shows a relatively low contact resistance and relatively high stability, and the manufacturing process is simple.

BRIEF DESCRIPTION OF THE DRAWINGS

The features and technical contents of the present invention will be better understood by referring to the following detailed description and drawings the present invention. However, the drawings are provided for the purpose of reference and illustration and are not intended to limit the scope of the present invention.

In the drawing.

DETAILED DESCRIPTION OF THE PREFERRED EMBODIMENTS

To further expound the technical solution adopted in the present invention and the advantages thereof, a detailed description is given to a preferred embodiment of the present invention with reference to the attached drawings.

Figure 1:
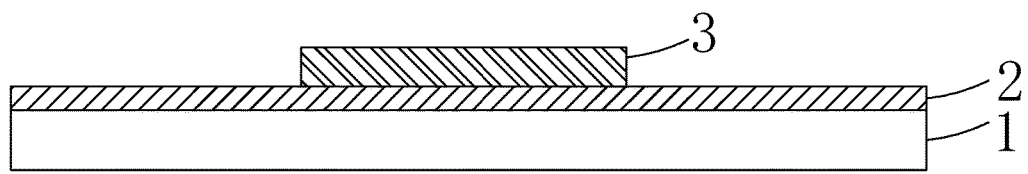
FIG. 1 is a schematic view illustrating step 1 of a manufacturing method of a top gate thin-film transistor according to the present invention.
Figure 7:
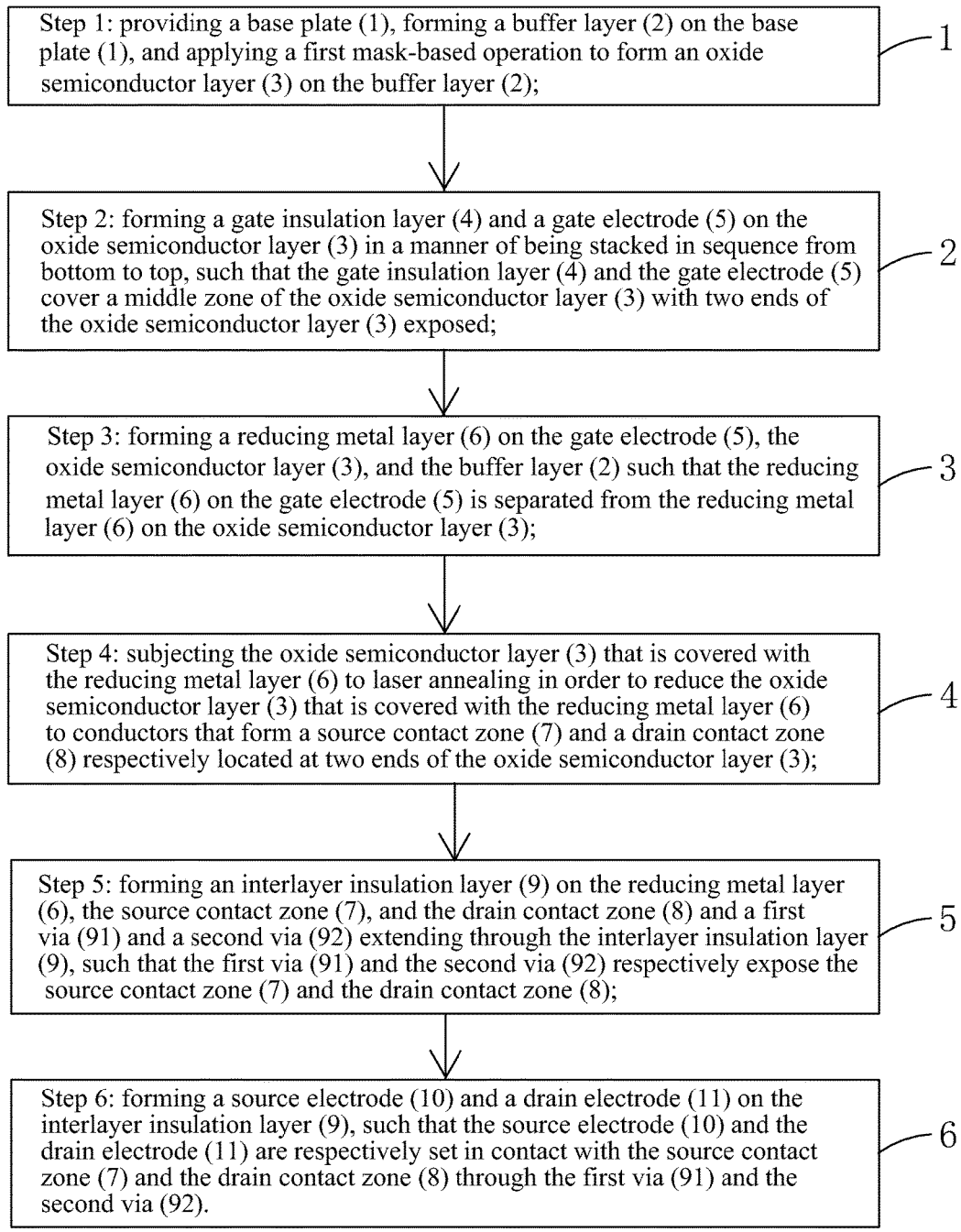
FIG. 7 is a flow chart illustrating the manufacturing method of a top gate thin-film transistor according to a preferred embodiment of the present invention.

Referring to FIG. 7, the present invention provides a manufacturing method of a top gate thin-film transistor, which comprises the following steps:

Step 1: referring to FIG. 1, providing a base plate 1, forming a buffer layer 2 on the base plate 1, and forming ab oxide semiconductor layer 3 on the buffer layer 2.

Specifically, Step 1 first forms the buffer layer 2 on the base plate 1 and then, forms an oxide semiconductor film on the buffer layer 2, followed by patterning the oxide semiconductor film with a mask-based operation to form the oxide semiconductor layer 3.

Further, the base plate 1 comprises a transparent plate, preferably a glass plate. The buffer layer 2 is formed of a material comprising one or a stacked combination of multiple ones of silicon oxide ($SiO_x$) and silicon nitride ($SiO_x$). The oxide semiconductor layer 3 in preferably formed of a material comprising indium gallium zinc oxide (IGZO).

Figure 2:
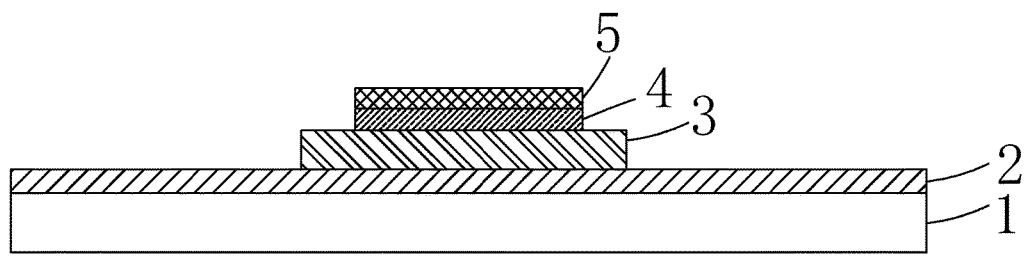
FIG. 2 is a schematic view illustrating step 2 of the manufacturing method of a top gate thin-film transistor according to the present invention.

Step 2: referring to FIG. 2, forming a gate insulation layer 4 and a gate electrode 5 on the oxide semiconductor layer 3 in a manner of being stacked in sequence from bottom to top, such that the gate insulation layer 4 and the gate electrode 5 cover a middle zone of the oxide semiconductor layer 3 with two ends of the oxide semiconductor layer 3 exposed.

Specifically, Step 2 first deposits an insulation film on the oxide semiconductor layer 3 and the buffer layer 2 and then deposits a first metal layer on the insulation film, followed by applying a dry etching operation to pattern the insulation film and the first metal layer so as to form the gate insulation layer 4 and the gate electrode 5, wherein using the dry etching operation would make a taper on a side of the gate insulation layer 4 and the gate electrode 5 steep so that when films are subsequently deposited on the gate insulation layer 4 and the gate electrode 5, the films would break at the side of the gate insulation layer 4 and the gate electrode 5. The gate insulation layer 4 and the gate electrode 5 are formed with the same mask-based operation.

Preferably, the gate electrode 5 is formed of a material comprising molybdenum (Mo) and the gate insulation layer 4 is formed of a material comprising one or a stacked combination of multiple ones of silicon oxide and silicon nitride.

Figure 3:
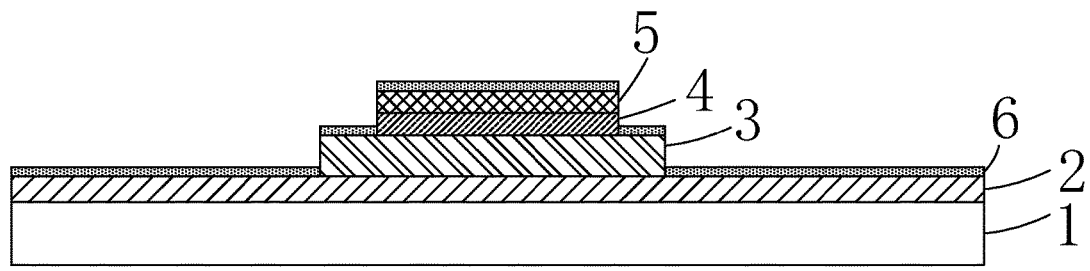
FIG. 3 is a schematic view illustrating step 3 of the manufacturing method of a top gate thin-film transistor according to the present invention.

Step 3: referring to FIG. 3, forming a reducing metal layer 6 on the gate electrode 5, the oxide semiconductor layer 3, and the buffer layer 2, such that a portion of the reducing metal layer 6 on the gate electrode 5 is separated from a portion of the reducing metal layer 6 on the oxide semiconductor layer 3.

Specifically, the reducing metal layer 6 is formed of a material comprising a metal of strong reducibility, of which a preferred material includes manganese (Mn) or aluminum (Al) and which is formed through physical vapor deposition having an extremely small thickness (less than 100 Å), making it not forming a film and thus not affecting light transmission, and breaking for separation can be automatically achieved at the side of the gate insulation layer 4 and the gate electrode 5 without application of etching.

Figure 4:
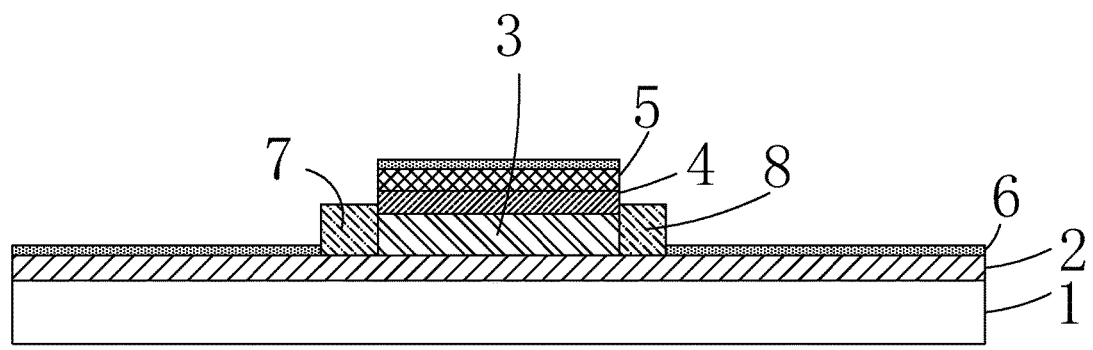
FIG. 4 is a schematic view illustrating step 4 of the manufacturing method of a top gate thin-film transistor according to the present invention.

Step 4: referring to FIG. 4, subjecting the oxide semiconductor layer 3 that is covered with the reducing metal layer 6 to laser annealing in order to reduce the oxide semiconductor layer 3 that is covered with the reducing metal layer 6 to conductors that form a source contact zone 7 and a drain contact zone 8 respectively located at two ends of the oxide semiconductor layer 3.

Specifically, Step 4 uses the reducibility characteristics of the reducing metal layer 6, in combination with a laser annealing operation, to reduce the oxide semiconductor layer 3 that is covered with the reducing metal layer 6 to conductors that form the source contact zone 7 and the drain contact zone 8 respectively so as to improve electrical conduction performance of the source contact zone 7 and the drain contact zone 8. Compared to the plasma treatment based processes that are conventionally used, a device manufactured with the present invention would show a relatively low contact resistance (less than 1000 Ω/sq) and relatively high stability.

Figure 5:
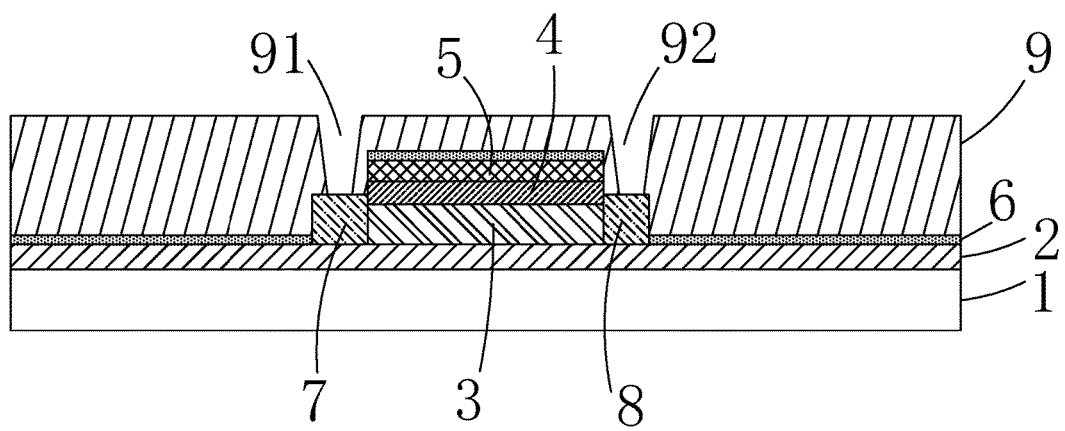
FIG. 5 is a schematic view illustrating step 5 of the manufacturing method of a top gate thin-film transistor according to the present invention.

Step 5: referring to FIG. 5, forming an interlayer insulation layer 9 on the reducing metal layer 6, the source contact zone 7, and the drain contact zone 8 and a first via 91 and a second via 92 extending through the interlayer insulation layer 9 such that the first via 91 and the second via 92 respectively expose the source contact zone 7 and the drain contact zone 8.

Specifically, Step 5 first deposits an insulation film on the reducing metal layer 6, the source contact zone 7, and the drain contact zone 8, followed by patterning the insulation film with a mask-based operation to thereby form the interlayer insulation layer 9 and the first via 91 and the second via 92 that extend through the interlayer insulation layer 9.

Preferably, the interlayer insulation layer 9 is formed of a material comprising one or a stacked combination of multiple ones of silicon oxide and silicon nitride.

Figure 6:
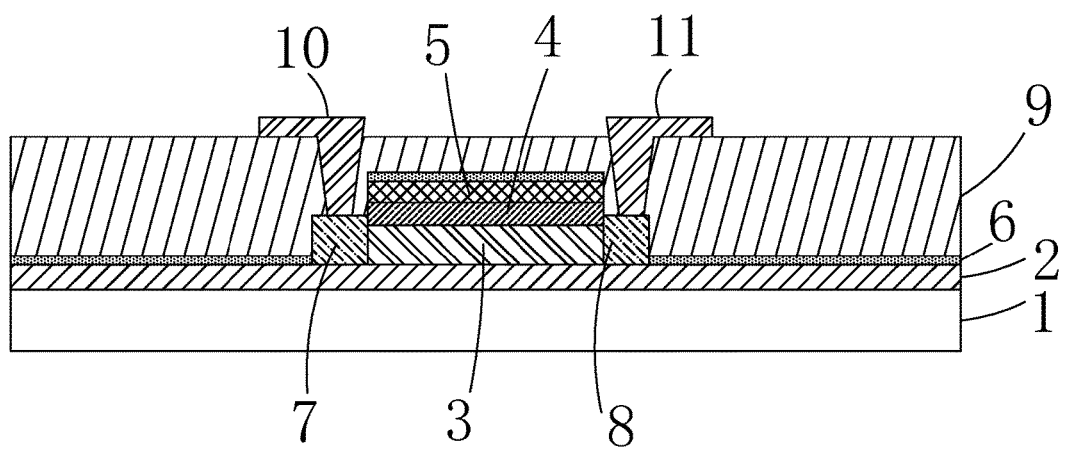
FIG. 6 is a schematic view illustrating step 6 of the manufacturing method of a top gate thin-film transistor according to the present invention.

Step 6: referring to FIG. 6, forming a source electrode 10 and a drain electrode 11 on the interlayer insulation layer 9, such that the source electrode 10 and the drain electrode 11 are respectively set in contact with the source contact zone 7 and the drain contact zone 8 through the first via 91 and the second via 92 respectively to complete manufacturing of a top gate thin-film transistor.

Specifically, Step 6 first deposits a second metal layer on the interlayer insulation layer 9, followed by patterning the second metal layer with a mask based operation to form the source electrode 10 and the drain electrode 11. Compared with prior art, the source contact zone 7 and the drain contact zone 8 that are in contact with the source electrode 10 and the drain electrode 11 are both conductors, rather than oxide semiconductors, so as to greatly reduce contact resistance of the source electrode 10 and the drain electrode 11.

Preferably, the source electrode 10 and the drain electrode 11 are formed of a material comprising Mo.

Figure 8:
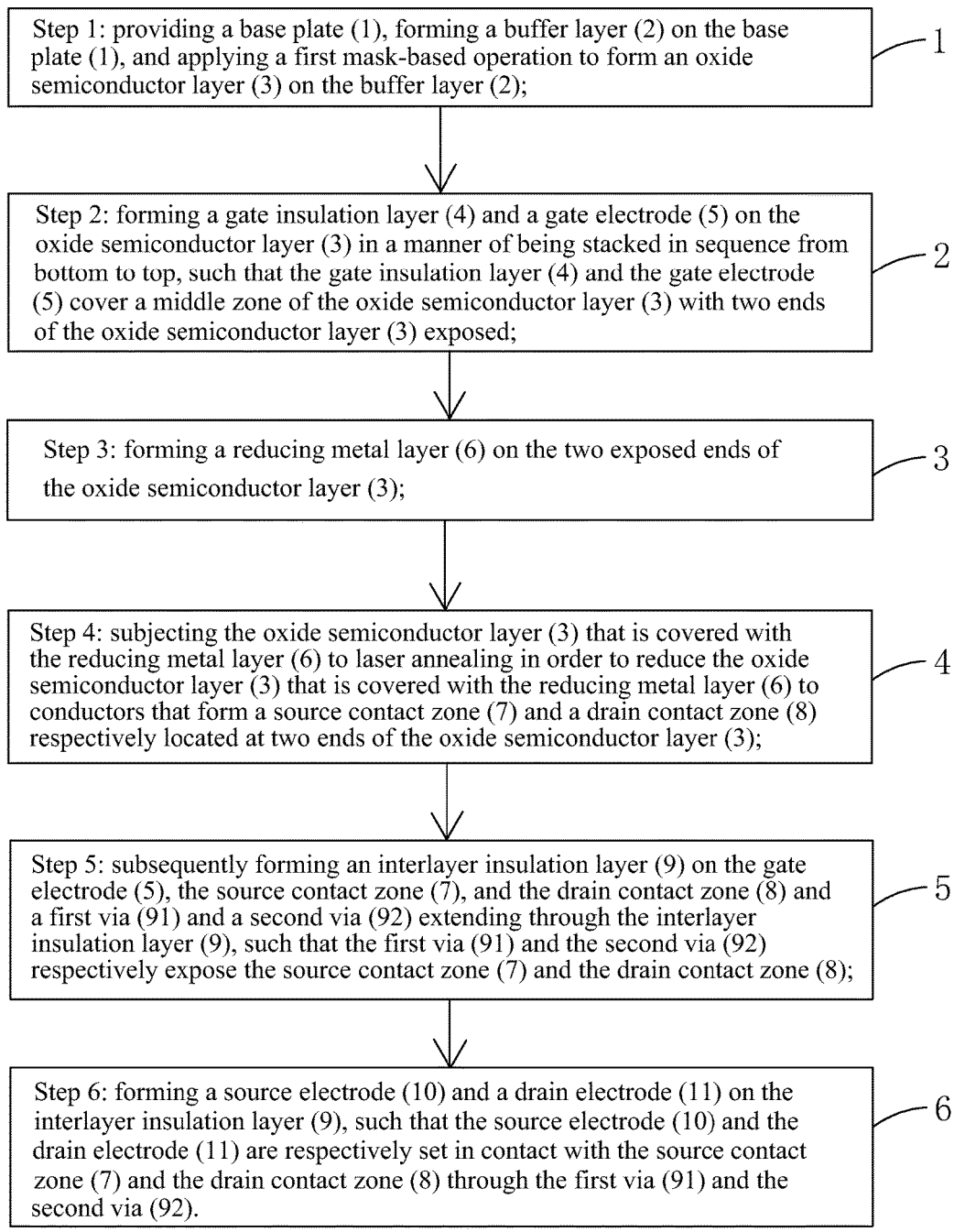
FIG. 8 is a flow chart illustrating the manufacturing method of a top gate thin-film transistor according to the present invention.

It is appreciated that according to FIG. 8, in other embodiments, Step 3 may involve forming the reducing metal layer only at two exposed ends of the oxide semiconductor and Step 5 may involve forming the interlayer insulation layer 9 directly on the gate electrode and/or the buffer layer. The embodiment described previously is just one preferred embodiment of the present invention and is not intended to imply undue limitations to the present invention.

In summary, the present invention provides a manufacturing method of a top gate thin-film transistor, which comprises forming a reducing metal layer on an oxide semiconductor layer and applying laser annealing to reduce the oxide semiconductor layer that is covered with the reducing metal layer to conductors to respectively form a source contact zone and a drain contact zone, such that the source contact zone and the drain contact zone are used to respectively contact a source electrode and a drain electrode thereby reducing the contact resistance of the source electrode and the drain electrode and improving the performance of a top gate thin-film transistor, and compared to a process involving plasma treatment, the top gate thin-film transistor manufactured with the present invention shows a relatively low contact resistance and relatively high stability, and the manufacturing process is simple.

Based on the description given above, those having ordinary skills of the art may easily contemplate various changes and modifications of the technical solution and technical ideas of the present invention and all these changes and modifications are considered within the protection scope of right for the present invention as defined in the appended claims.

What is claimed is:

1. A manufacturing method of a top gate thin-film transistor, comprising the following steps:
   Step 1: providing a base plate, forming a buffer layer on the base plate, and forming an oxide semiconductor layer on the buffer layer;
   Step 2: forming a gate insulation layer and a gate electrode on the oxide semiconductor layer in a manner of being stacked in sequence from bottom to top, such that the gate insulation layer and the gate electrode cover a middle zone of the oxide semiconductor layer with two ends of the oxide semiconductor layer exposed;
   Step 3: forming a reducing metal layer on the two exposed ends of the oxide semiconductor layer;
   Step 4: subjecting the oxide semiconductor layer that is covered with the reducing metal layer to laser annealing in order to reduce the oxide semiconductor layer that is covered with the reducing metal layer to conductors that form a source contact zone and a drain contact zone respectively located at two ends of the oxide semiconductor layer;
   Step 5: subsequently forming an interlayer insulation layer on the gate electrode, the source contact zone, and the drain contact zone and a first via and a second via extending through the interlayer insulation layer, such that the first via and the second via respectively expose the source contact zone and the drain contact zone; and Step 6: forming a source electrode and a drain electrode on the interlayer insulation layer, such that the source electrode and the drain electrode are respectively set in contact with the source contact zone and the drain contact zone through the first via and the second via;

wherein the reducing metal layer comprises two parts that are respectively formed on the two exposed ends of the oxide semiconductor and are separate from each other such that laser annealing is applied only to the two exposed ends of he oxide semiconductor layer.

2. The manufacturing method of a top gate thin-film transistor as claimed in claim 1, wherein in Step 3, the reducing metal layer is formed of a material comprising manganese or aluminum.

3. The manufacturing method of a top gate thin-film transistor as claimed in claim 1, wherein in Step 3, the reducing metal layer has a thickness less than 100 Å.

4. The manufacturing method of a top gate thin-film transistor as claimed in claim 1, wherein in Step 3, the reducing metal layer is formed with physical vapor deposition.

5. The manufacturing method of a top gate thin-film transistor as claimed in claim 1, wherein the oxide semiconductor layer is formed of a material comprising indium gallium zinc oxide (IGZO).

6. The manufacturing method of a top gate thin-film transistor as claimed in claim 1, wherein the gate electrode, the source electrode, and the drain electrode are formed of a material comprising molybdenum.

7. The manufacturing method of a top gate thin-film transistor as claimed in claim 1, wherein in Step 2, a dry etching operation is applied to form the gate insulation layer and the gate electrode.

8. The manufacturing method of a top gate thin-film transistor as claimed in claim 1, wherein Step 3 further comprises forming the reducing metal layer on the gate electrode and the buffer layer, such that a portion of the reducing metal layer on the gate electrode is separated from a portion of the reducing metal layer on the oxide semiconductor layer; and in Step 5, the interlayer insulation layer covers the portion of the reducing metal layer on the gate electrode.

9. The manufacturing method of a top gate thin-film transistor as claimed in claim 8, wherein in Step 3, a portion of the reducing metal layer on the oxide semiconductor layer is separated from a portion of the reducing metal layer on the buffer layer.

10. The manufacturing method of a top gate thin-film transistor as claimed in claim 1, wherein the buffer layer, the gate insulation layer, and the interlayer insulation layer are formed of a material comprising one or a stacked combination of multiple ones of silicon oxide and silicon nitride.

11. A manufacturing method of a top gate thin-film transistor, comprising the following steps:

Step 1: providing a base plate, forming a buffer layer on the base plate, and forming an oxide semiconductor layer on the buffer layer;

Step 2: forming a gate insulation layer and a gate electrode on the oxide semiconductor layer in a manner of being stacked in sequence from bottom to top, such that the gate insulation layer and the gate electrode cover a middle zone of the oxide semiconductor layer with two ends of the oxide semiconductor layer exposed;

Step 3: forming a reducing metal layer on the two exposed ends of the oxide semiconductor layer;

Step 4: subjecting the oxide semiconductor layer that is covered with the reducing metal layer to laser annealing in order to reduce the oxide semiconductor layer that is covered with the reducing metal layer to conductors that form a source contact zone and a drain contact zone respectively located at two ends of the oxide semiconductor layer;

Step 5: subsequently forming an interlayer insulation layer on the gate electrode, the source contact zone, and the drain contact zone and a first via and a second via extending through the interlayer insulation layer, such that the first via and the second via respectively expose the source contact zone and the drain contact zone; and Step 6: forming a source electrode and a drain electrode on the interlayer insulation layer, such that the source electrode and the drain electrode are respectively set in contact with the source contact zone and the drain contact zone through the first via and the second via;

wherein the reducing metal layer comprises two parts that are respectively formed on the two exposed ends of the oxide semiconductor and are separate from each other such that laser annealing is applied only to the two exposed ends of the oxide semiconductor layer;

wherein in Step 3, the reducing metal layer is formed of a material comprising manganese or aluminum; and wherein in Step 3, the reducing metal layer has a thickness less than 100 Å.

12. The manufacturing method of a top gate thin-film transistor as claimed in claim 11, wherein in Step 3, the reducing metal layer is formed with physical vapor deposition.

13. The manufacturing method of a top gate thin-film transistor as claimed in claim 11, wherein the oxide semiconductor layer is formed of a material comprising indium gallium zinc oxide (IGZO).

14. The manufacturing method of a top gate thin-film transistor as claimed in claim 11, wherein the gate electrode, the source electrode, and the drain electrode are formed of a material comprising molybdenum.

15. The manufacturing method of a top gate thin-film transistor as claimed in claim 11, wherein in Step 2, a dry etching operation is applied to form the gate insulation layer and the gate electrode.

16. The manufacturing method of a top gate thin-film transistor as claimed in claim 11, wherein Step 3 further comprises forming the reducing metal layer on the gate electrode and the buffer layer, such that a portion of the reducing metal layer on the gate electrode is separated from a portion of the reducing metal layer on the oxide semiconductor layer; and in Step 5, the interlayer insulation layer covers the portion of the reducing metal layer on the gate electrode.

17. The manufacturing method of a top gate thin-film transistor as claimed in claim 16, wherein in Step 3, a portion of the reducing metal layer on the oxide semiconductor layer is separated from a portion of the reducing metal layer on the buffer layer.

18. The manufacturing method of a top gate thin-film transistor as claimed in claim 11, wherein the buffer layer, the gate insulation layer, and the interlayer insulation layer are formed of a material comprising one or a stacked combination of multiple ones of silicon oxide and silicon nitride.

* * * * *